United States Patent
Lin et al.

(10) Patent No.: US 10,347,481 B2
(45) Date of Patent: Jul. 9, 2019

(54) SILICON CARBIDE WAFER AND METHOD FOR PRODUCTION THEREOF

(71) Applicant: GLOBALWAFERS CO., LTD., Hsinchu (TW)

(72) Inventors: Ching-Shan Lin, Hsinchu (TW); Jian-Hsin Lu, Hsinchu (TW); Chien-Cheng Liou, Hsinchu (TW); I-Ching Li, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/842,967

(22) Filed: Dec. 15, 2017

(65) Prior Publication Data
US 2019/0115205 A1 Apr. 18, 2019

(30) Foreign Application Priority Data
Oct. 18, 2017 (TW) .............................. 106135711 A

(51) Int. Cl.
*H01L 29/15* (2006.01)
*H01L 21/02* (2006.01)

(52) U.S. Cl.
CPC .. *H01L 21/02024* (2013.01); *H01L 21/02019* (2013.01)

(58) Field of Classification Search
CPC combination set(s) only.
See application file for complete search history.

(56) References Cited

U.S. PATENT DOCUMENTS

| | | | |
|---|---|---|---|
| 2004/0055998 A1* | 3/2004 | Letertre | B24B 37/044 216/52 |
| 2008/0173843 A1* | 7/2008 | Hotta | C09G 1/02 252/79.1 |
| 2017/0279435 A1 | 9/2017 | Geshi et al. | |

FOREIGN PATENT DOCUMENTS

TW 201735278 A 10/2017

* cited by examiner

*Primary Examiner* — Robert G Bachner
(74) *Attorney, Agent, or Firm* — Osha Liang LLP

(57) ABSTRACT

A method for producing a silicon carbide wafer includes: providing a silicon carbide wafer having an unpolished surface; in which the unpolished surface has a first crystal face and a second crystal face; polishing one face of the first crystal face and the second crystal face of the unpolished surface in a first polishing solution by using a polisher; in which the polisher includes a polishing pad and a plurality of abrasive particles fixed on the polishing pad; and polishing the other face of the first crystal face and the second crystal face of the unpolished surface in a second polishing solution by using the polisher; in which a pH value of the first polishing solution is less than or equal to 7, and a pH value of the second polishing solution is greater than or equal to 7. The present disclosure also provides a silicon carbide wafer.

4 Claims, 2 Drawing Sheets

SILICON CARBIDE WAFER AND METHOD FOR PRODUCTION THEREOF

BACKGROUND OF THE INVENTION

1. Field of the Invention

The present disclosure relates to a semiconductor wafer and a method for producing the same; in particularly, to a silicon carbide wafer and a method for producing the same.

2. Description of Related Art

Silicon carbide wafers, as the wide-bandgap semiconductors, have the features of high thermal conductivity and high saturated electron drift rates. Because of the growing demand for high-speed and high-frequency radio technologies, the wide-bandgap semiconductors are attracting more and more attention. This type of semiconductor devices has many advantages which conventional silicon-based semiconductors cannot have, such as the capability of being operated at higher power levels, higher temperatures, and harsher environments. In fact, metal-semiconductor field-effect transistors (MESFETs) and metal-oxide-semiconductor field-effect transistors (MOSFETs) fabricated on the basis of the silicon carbide wafers have been realized. Therefore, to obtain high-quality silicon carbide wafer (silicon carbide substrate) becomes more and more important. The so-called high-quality not only refers to the quality of the silicon carbide wafer itself, but also refers to the surface quality (low defect rate) and the excellent flatness parameters of the silicon carbide wafer. Obtaining high-quality silicon carbide wafer is not only the demand for the semiconductor device, but also the demand for the epitaxial film. In fact, the epitaxial film has high dependence on the silicon carbide wafer. When the surface roughness of the silicon carbide wafer is large, the quality of the epitaxial film will be seriously affected. Meanwhile, the quality of the epitaxial layer grown from the epitaxial film will also be affected by the surface defects and flatness of the silicon carbide wafer. All defects on the silicon carbide wafer will be transmitted to the new epitaxial layer. These defects not only cause leakage phenomena, but also significantly reduce the electron mobility.

In this regards, the present disclosure provides a silicon carbide wafer and a method for producing the same to overcome the aforementioned drawbacks.

SUMMARY OF THE INVENTION

The main object of the present disclosure is to effectively improve the drawbacks of defects and poor flatness on the surface of the silicon carbide wafer in the related art.

To resolve the above technical problems, the present disclosure provides a method for producing a silicon carbide wafer which includes: providing a silicon carbide wafer having an unpolished surface; in which the unpolished surface has a first crystal face and a second crystal face; polishing one face of the first crystal face and the second crystal face of the unpolished surface in a first polishing solution by using a polisher; in which the polisher includes a polishing pad and a plurality of abrasive particles fixed on the polishing pad; and polishing the other face of the first crystal face and the second crystal face of the unpolished surface in a second polishing solution by using the polisher; in which a pH value of the first polishing solution is less than or equal to 7, and a pH value of the second polishing solution is greater than or equal to 7.

The present disclosure also provides a silicon carbide wafer including two surfaces on opposite sides; in which at least one surface of the two surfaces is a polished surface, and the polished surface includes a reference surface and a microstructure module. The reference surface is not formed with a scratch greater than 5 micrometers in length. The microstructure module is formed on the reference surface. The microstructure module includes a plurality of micro-depressions depressed in the reference surface, and a plurality of micro-protrusions protruding from the reference surface; in which an arithmetic mean deviation of surface (Sa) of the microstructure module is less than 2.5 nanometers, and a maximum height of surface (Sz) of the microstructure module is less than 20 nanometers.

As described above, the method for producing the silicon carbide wafer of the present disclosure can efficiently improve the surface flatness of the silicon carbide wafer and reduce scratches or defects (micro-depressions and micro-protrusions) on the surface of the silicon carbide wafer through polishing the first crystal face and the second crystal face of the unpolished surface with the first polishing solution and the second polishing solution, and through the abrasive particles fixed on the polishing pad.

In addition, the silicon carbide wafer of the present disclosure can provide the scratch-free polished surface and has excellent flatness parameters (Sa is less than 2.5 nm and Sz is less than 20 nm) so as to effectively reduce the defects transmitted to the epitaxial layer and enhance the quality of the epitaxial layer in subsequent applications.

For further understanding of the present disclosure, the following embodiments are provided along with illustrations to facilitate the disclosure of the present disclosure.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings. In addition, for an easy instruction, similar reference numbers or symbols refer to elements alike.

[Method for Producing Silicon Carbide Wafer]

Figure 1:
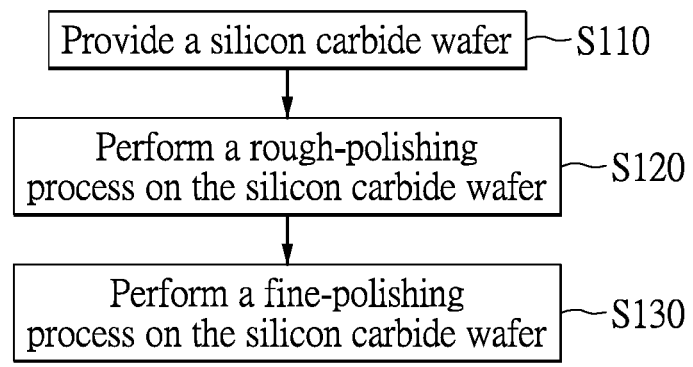
FIG. 1 is a flow chart of a method for producing a silicon carbide wafer according to an embodiment of the present disclosure.

Referring to FIG. 1, the present embodiment discloses a method for producing a silicon carbide wafer. The method for producing the silicon carbide wafer includes step S110, step S120, and step S130. It should be noted that the order and the practical operation mode of the steps described in the present embodiment can be adjusted as needed, and the present disclosure is not limited thereto.

Step S110 is to provide a silicon carbide wafer. The silicon carbide wafer has at least one unpolished surface. That is, the silicon carbide wafer has two surfaces on opposite sides, and can have the unpolished surface on one side thereof (single-side polishing process). The silicon carbide wafer can also have the unpolished surfaces on opposite sides thereof (double-side polishing process).

In addition, the unpolished surface has a first crystal face and a second crystal face, and the crystal orientation of the first crystal face is different from the crystal orientation of the second crystal face. In the present embodiment, the first crystal face is a carbon face, and the second crystal face is a silicon face, but the present disclosure is not limited thereto. The unpolished surface of the silicon carbide wafer in the present embodiment is a surface that has not been polished by the polishing process, and the size of the silicon carbide wafer is four inches, but the present disclosure is not limited thereto. For example, the size of the silicon carbide wafer can also be six inches or other larger/smaller sizes. In addition, when the silicon carbide wafer is subjected to a receiving inspection, an arithmetic mean roughness Ra (also called arithmetic mean deviation of profile) of the unpolished surface can be less than 7 nanometers, but the present disclosure is not limited thereto.

Step S120 is to perform a rough-polishing process on the silicon carbide wafer. The rough-polishing process includes: polishing one face of the first crystal face and the second crystal face of the unpolished surface in a first polishing solution by using a polisher; and polishing the other face of the first crystal face and the second crystal face of the unpolished surface in a second polishing solution by using the polisher. The polisher includes a polishing pad and a plurality of abrasive particles fixed on the polishing pad, and neither the first polishing solution nor the second polishing solution includes any abrasive particle. In addition, a pH value of the first polishing solution is less than or equal to 7 (acidic polishing solution), and a pH value of the second polishing solution is greater than or equal to 7 (alkaline polishing solution).

Further, in the rough-polishing process of the present embodiment, the polisher has polishing parameters of a polishing pressure of greater than 20 g/cm$^2$, a rotational speed of higher than or equal to 25 rpm, and a chemical mechanical polishing time of between 0.5 and 2 hours. In the polisher, the abrasive particles fixed on the polishing pad have an average particle diameter of smaller than 20 μm, and a density of the abrasive particles distributed on the polishing pad is less than 50%. In addition, the abrasive particles are at least one substance selected from the group consisting of diamond, silicon carbide, aluminum oxide, boron carbide, and cubic boron nitride. In the present embodiment, the abrasive particles are the substance of diamond, but the present disclosure is not limited thereto.

The pH value of the first polishing solution of the present embodiment is preferably less than or equal to 2 (acidic polishing solution), and the polisher polishes the first crystal face (carbon face) of the unpolished surface in the first polishing solution. The pH value of the second polishing solution of the present embodiment is preferably greater than or equal to 8 (alkaline polishing solution), and the polisher polishes the second crystal face (silicon face) of the unpolished surface in the second polishing solution. After the rough-polishing process, the arithmetic mean roughness (Ra) of the unpolished surface is between 0.5 nanometers and 1 nanometer.

More specifically, the first polishing solution (acidic polishing solution) includes an oxidizing agent, and the oxidizing agent is at least one substance selected from the group consisting of permanganate, hydrogen peroxide, potassium hydrogen persulfate, cerium ammonium nitrate, periodate, iodate, persulfate, chlorate, chromate, bromate, perbromate, ferric acid salts, perrhenates, and perruthenates. In the present embodiment, the oxidizing agent is the substance of permanganate, but is not limited thereto. Further, the second polishing solution (alkaline polishing solution) includes a metal salt, and the metal salt is at least one substance selected from the group consisting of sodium carbonate, potassium carbonate, sodium hydroxide, potassium hydroxide, ammonium hydroxide, and tetramethylammonium hydroxide. In the present embodiment, the metal salt is the substance of potassium hydroxide, but is not limited thereto.

It should be noted that, in the rough-polishing process of the present embodiment, it is preferable to polish the first crystal face (carbon face) of the unpolished surface with the first polishing solution, and then polish the second crystal face (silicon face) of the unpolished surface with the second polishing solution. The main reason is that the hardness of the first crystal face (carbon face) is greater than the hardness of the second crystal face (silicon face). In addition, the general industry demands a higher surface quality on the second crystal face (silicon face). The more the processing times are, the higher possibility of damage to the second crystal face (silicon face) of the silicon carbide wafer is. To reduce the processing times on the second crystal face (silicon face), the surface processing of the first crystal face (carbon face) is firstly performed, but the present disclosure is not limited thereto. For example, in another embodiment of the present disclosure, the rough-polishing process can also be polishing the second crystal face of the unpolished surface with the first polishing solution having the pH value of greater than or equal to 8 (alkaline polishing solution); and then polishing the first crystal face of the unpolished surface with the second polishing solution having the pH value of not greater than 2 (acidic polishing solution).

Step S130 is to perform a fine-polishing process on the silicon carbide wafer. The fine-polishing process includes: polishing one face of the first crystal face and the second crystal face of the unpolished surface in a third polishing solution by using the polisher; and polishing the other face of the first crystal face and the second crystal face of the unpolished surface in a fourth polishing solution by using the polisher so that the unpolished surface is formed as a polished surface. In addition, a pH value of the third polishing solution is less than or equal to 7 (acidic polishing solution), a pH value of the fourth polishing solution is greater than or equal to 7 (alkaline polishing solution), and neither the third polishing solution nor the fourth polishing solution includes any abrasive particle.

Further, in the fine-polishing process of the present embodiment, the polisher has polishing parameters of a polishing pressure of greater than 15 g/cm$^2$, a rotational speed of higher than or equal to 15 rpm, and a chemical mechanical polishing time of between 0.5 and 2 hours. The specifications of the polisher used in the fine-polishing process are the same as or similar to the specifications of the polisher used in the rough-polishing process, and details will not be redundantly described herein.

The pH value of the third polishing solution of the present embodiment is preferably less than or equal to 4 (acidic polishing solution), and the polisher polishes the first crystal face of the unpolished surface in the third polishing solution. The pH value of the fourth polishing solution of the present embodiment is preferably greater than or equal to 8 (alkaline polishing solution), and the polisher polishes the second crystal face of the unpolished surface in the fourth polishing solution. After the fine-polishing process, the arithmetic mean roughness (Ra) of the polished surface is less than 0.5 nanometers, an arithmetic mean deviation of surface Sa (also called three-dimensional arithmetic mean deviation) of the polished surface is less than 2.5 nanometers, a maximum height of surface Sz (also called three-dimensional contour height difference) of the polished surface is less than 20 nanometers, and the polished surface is not formed with a scratch having a length greater than 5 micrometers (μm). In addition, the rough-polishing process and the fine-polishing process have a removal rate of about 0.1 micrometer per hour on the thickness of the polished surface (or the unpolished surface).

More specifically, the third polishing solution (acidic polishing solution) is similar to the first polishing solution used in the rough-polishing process (i.e. the third polishing solution includes an oxidizing agent), and the fourth polishing solution (alkaline polishing solution) is similar to the second polishing solution used in the rough-polishing process (i.e. the fourth polishing solution includes a metal salt).

Similar to the rough-polishing process described above, in the fine-polishing process of the present embodiment, it is preferable to polish the first crystal face of the unpolished surface with the third polishing solution, and then polish the second crystal face of the unpolished surface with the fourth polishing solution, but the present disclosure is not limited thereto. For example, in another embodiment of the present disclosure, the fine-polishing process can also be polishing the second crystal face of the unpolished surface with the third polishing solution having the pH value of greater than or equal to 8 (alkaline polishing solution); and then polishing the first crystal face of the unpolished surface with the fourth polishing solution having the pH value of less than or equal to 4 (acidic polishing solution).

[Testing of Polished Surface of Silicon Carbide Wafer]

Figure 2:
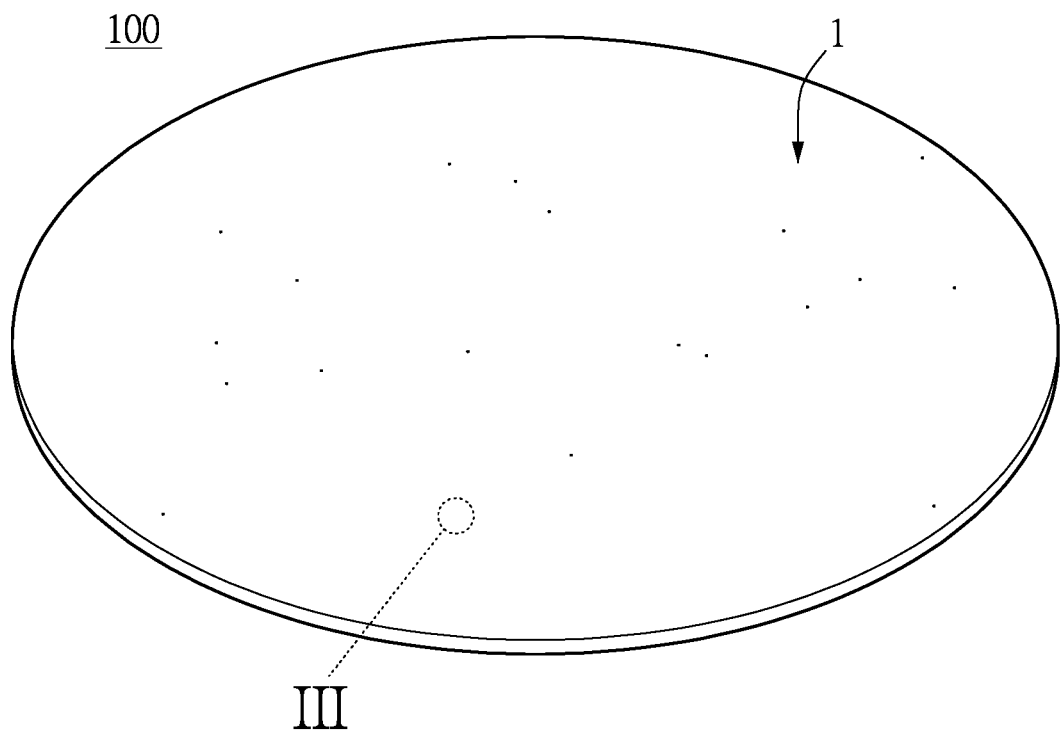
FIG. 2 is a perspective view of the silicon carbide wafer according to an embodiment of the present disclosure.
Figure 3:
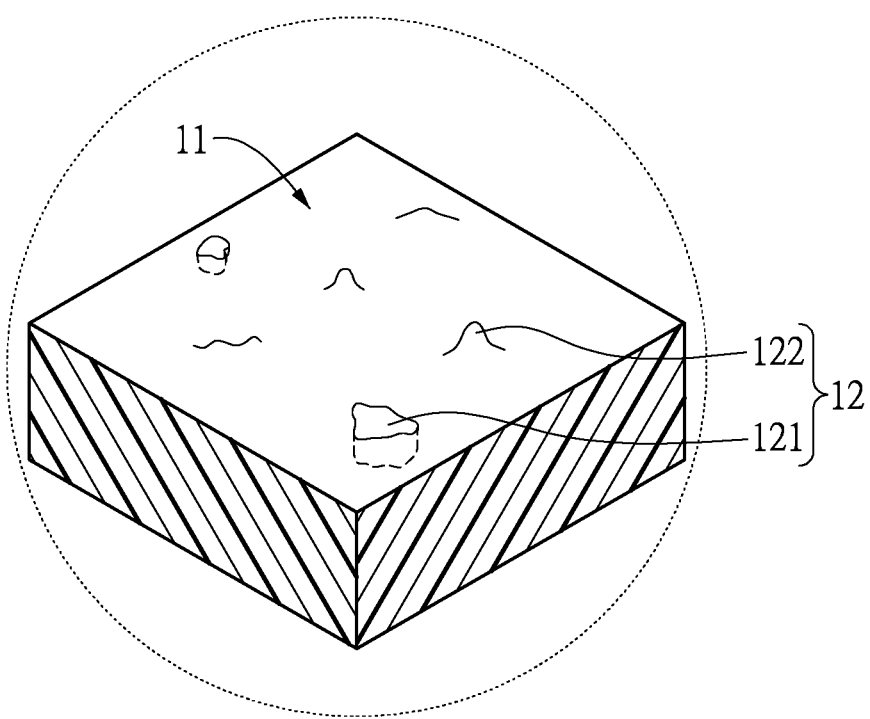
FIG. 3 is a partially enlarged view of the polished surface in FIG. 2.

Referring to FIG. 2 and FIG. 3, for the polished surface 1 of the silicon carbide wafer 100 processed by the method for producing silicon carbide wafer 100 described above, the detailed testing methods and testing results thereof are described as follows. In the present embodiment, a four-inch silicon carbide wafer is used for the polishing process (including the rough and the fine polishing process), but the present disclosure is not limited thereto.

Testing of the surface roughness of the wafer (Sa, Sz): taking out three pieces of the plurality of the silicon carbide wafers 100 processed by the method for producing silicon carbide wafer 100 described above as the wafer surface roughness test pieces (numbered 1, 2, and 3); and testing the wafer surface roughness test pieces by using the white light interferometer and according to the white light interferometry principles and the international standard organization ISO 25178 to obtain an arithmetic mean deviation of surface (Sa) and a maximum height of surface (Sz) of the microstructure module 12 as shown in FIG. 3. It should be noted that the wafer surface roughness was obtained by testing thirteen points evenly distributed on the polished surface 1 of each test piece and averaging the test results of the thirteen points. Related test results are shown in Table 1 (only shows the average value of each parameter).

TABLE 1

| test items | test piece number | | |
|---|---|---|---|
|  | 1 | 2 | 3 |
| $S_a$ (nm) | 2.27 | 1.31 | 1.07 |
| $S_z$ (nm) | 15.08 | 12.99 | 11.30 |
| $S_a/S_z$ | 0.15 | 0.10 | 0.09 |

As shown in Table 1, the wafer surface roughness test pieces (numbered 1, 2 and 3) have the arithmetic mean deviation of surface (Sa) of between 1.07 nm and 2.27 nm (less than 2.5 nm), the maximum height of surface (Sz) of between 11.30 nm and 15.08 nm (less than 20 nm), and the ratio of the arithmetic mean deviation of surface to the maximum height of surface (Sa/Sz) of between 0.09 and 0.15 (less than 0.25).

Testing of the surface defects of the wafer (scratch, pit defect, bump defect): taking out one piece of the plurality of the silicon carbide wafers 100 processed by the method for producing silicon carbide wafer 100 described above as the wafer surface defect test piece; and testing the surface defect of the polished surface 1 (including the reference surface 11) of the wafer surface defect test piece. The test items include the number of scratches, and the number of micro-depressions 121 (also called pit defect) and micro-protrusions 122 (also called bump defect) of the microstructure module 12 (as shown in FIG. 3), in which the scratch is defined as a surface defect with a length greater than 5 micrometers. Further, when testing the surface defects of the wafer, the number of various defects in the entire polished surface 1 is tested, and then the number of defects in the area of the polished surface 1 per square centimeter ($cm^2$) is further calculated. The calculation method is dividing the number of defects by the surface area (about 71.5 $cm^2$) of the four-inch wafer. Related test results are shown in Table 2.

TABLE 2

| test items/area of defects ($\mu m^2$) | 0-5 | 5-10 | 10-25 |
|---|---|---|---|
| number of scratches | 0 | 0 | 0 |
| number of micro-depressions | 18 | 30 | 21 |
| number of micro-protrusions | 9 | 9 | 19 |

| test items/area of defects ($\mu m^2$) | 25-50 | 50- | total |
|---|---|---|---|
| number of scratches | 0 | 0 | 0 |
| number of micro-depressions | 0 | 0 | 69 |
| number of micro-protrusions | 0 | 0 | 37 |

| test items/area of defects ($\mu m^2$) | number of defects per $cm^2$ | | |
|---|---|---|---|
| number of scratches | 0 | | |
| number of micro-depressions | 0.96 | | |
| number of micro-protrusions | 0.52 | | |

As shown in Table 2, since the total number of scratches on the polished surface 1 of the wafer surface defect test piece is zero, the number of scratches in the area of the polished surface 1 per square centimeter is also zero. Since the total number of micro-depressions 121 of the microstructure module 12 is 69, the number of micro-depressions 121 in the area of the polished surface 1 per square centimeter is only 0.96 (less than one). Since the total number of micro-protrusions 122 of the microstructure module 12 is 37, the number of micro-protrusions 122 in the area of the polished surface 1 per square centimeter is only 0.52 (less than one). In general, the sum of the number of the micro-depressions 121 and the micro-protrusions 122 in the area of the polished surface 1 (including the reference surface 11) per square centimeter is less than three; and a projection region defined by orthogonally projecting each of the micro-depressions 121 or each of the micro-protrusions 122 of the microstructure module 12 onto the reference surface 11 has an area less than 100 square micrometers ($\mu m^2$). It is worth mentioning that in all the micro-depressions 121 and the micro-protrusions 122, each defect has the defect area less than 25 square micrometers ($\mu m^2$). That is, in the polished surface 1 (including the reference surface 11), there are no micro-depressions 121 or micro-protrusions 122 larger than 25 square micrometers.

[Silicon Carbide Wafer]

Referring to FIG. 2 and FIG. 3, the present embodiment also discloses a silicon carbide wafer 100. The silicon carbide wafer 100 can be processed by the method for producing silicon carbide wafer 100 described above, but the present disclosure is not limited thereto.

More specifically, the silicon carbide wafer 100 includes two surfaces on opposite sides thereof, and at least one surface of the two surfaces is a polished surface 1. The polished surface 1 includes a reference surface 11 and a microstructure module 12. The reference surface 11 is not formed with a scratch greater than 5 micrometers in length (not shown in figures). In other words, the silicon carbide wafer 100 of the present embodiment includes the scratch-free polished surface 1.

The microstructure module 12 is formed on the reference surface 11. The microstructure module 12 includes a plurality of micro-depressions 121 (also called pit defect) depressed in the reference surface 11, and a plurality of micro-protrusions 122 (also called bump defect) protruding from the reference surface 11. In addition, an arithmetic mean deviation of surface (Sa) of the microstructure module 12 is less than 2.5 nanometers, a maximum height of surface (Sz) of the microstructure module 12 is less than 20 nanometers, and the ratio of the arithmetic mean deviation of surface to the maximum height of surface (Sa/Sz) is less than 0.25.

Further, a number of the micro-depressions 121 in an area of the reference surface 11 per square centimeter ($cm^2$) is less than one, and a number of the micro-protrusions 122 in the area of the reference surface 11 per square centimeter is less than one. In general, the sum of the number of the micro-depressions 121 and the micro-protrusions 122 in the area of the reference surface 11 per square centimeter is less than three; and a projection region defined by orthogonally projecting each of the micro-depressions 121 or each of the micro-protrusions 122 of the microstructure module 12 onto the reference surface 11 has an area less than 100 square micrometers ($\mu m^2$).

[Advantageous Effect of the Present Disclosure]

As described above, the method for producing the silicon carbide wafer of the present disclosure can efficiently improve the flatness of the polished surface 1 of the silicon carbide wafer 100 (Sa is less than 2.5 nm and Sz is less than 20 nm) and reduce scratches or defects (micro-depressions 121 and micro-protrusions 122) of the polished surface 1 of the silicon carbide wafer 100 through polishing the first crystal face of the unpolished surface with the first polishing solution, and then polishing the second crystal face of the unpolished surface with the second polishing solution in the rough-polishing process; through polishing the first crystal face of the unpolished surface with the third polishing solution, and then polishing the second crystal face of the unpolished surface with the fourth polishing solution in the fine-polishing process; and through the abrasive particles fixed on the polishing pad.

Further, if the polishing solution includes a plurality of abrasive particles, the abrasive particles often agglomerate with each other, so that the abrasive particles cannot be uniformly dispersed in the polishing solution. Accordingly, the abrasive particles agglomerated with each other can easily form scratches or defects on the surface of the silicon carbide wafer 100 when performing the polishing process. With respect to the drawbacks described above, the method for producing the silicon carbide wafer of the present disclosure can prevent the agglomeration of the abrasive particles and can effectively reduce the scratches on the surface of the silicon carbide wafer 100 by fixing the abrasive particles on the polishing pad.

In addition, the silicon carbide wafer 100 of the present disclosure can provide the scratch-free polished surface 1 and has excellent flatness parameters (Sa is less than 2.5 nm and Sz is less than 20 nm) so as to effectively reduce the defects transmitted to the epitaxial layer and enhance the quality of the epitaxial layer in subsequent applications.

The descriptions illustrated supra set one simply the preferred embodiment of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A method for producing a silicon carbide wafer, comprising:
   providing a silicon carbide wafer having an unpolished surface; wherein the unpolished surface has a first crystal face and a second crystal face; wherein the first crystal face is a carbon face and the second crystal face is a silicon face;
   polishing the first crystal face of the unpolished surface in a first polishing solution by using a polisher; wherein the polisher includes a polishing pad and a plurality of abrasive particles fixed on the polishing pad;
   after polishing the first crystal face in the first polishing solution, polishing the second crystal face of the unpolished surface in a second polishing solution by using the polisher; wherein a pH value of the first polishing solution is less than or equal 2, to and a pH value of the second polishing solution is greater than or equal to 8;
   after polishing the second crystal face in the second polishing solution, polishing the first crystal face of the unpolished surface in a third polishing solution by using the polisher; and
   after polishing the first crystal face in the third polishing solution, polishing the second crystal face of the unpolished surface in a fourth polishing solution by using the polisher so that the unpolished surface is formed as a polished surface; wherein the pH value of the third polishing solution is less than or equal to 7, and a pH value of the fourth polishing solution is greater than or equal to 7.

2. The method for producing the silicon carbide wafer according to claim 1, wherein the first polishing solution includes an oxidizing agent, and the second polishing solution includes a metal salt.

3. The method for producing the silicon carbide wafer according to claim 1, wherein the pH value of the third polishing solution is less than or equal to 4, and the polisher polishes the first crystal face of the unpolished surface in the third polishing solution; wherein the pH value of the fourth polishing solution is greater than or equal to 8, and the polisher polishes the second crystal face of the unpolished surface in the fourth polishing solution; wherein an arithmetic mean deviation of surface (Sa) of the polished surface is less than 2.5 nanometers, a maximum height of surface (Sz) of the polished surface is less than 20 nanometers, and the polished surface is not formed with a scratch having a length greater than 5 micrometers.

4. The method for producing the silicon carbide wafer according to claim 1, wherein neither the first polishing solution nor the second polishing solution includes any abrasive particle.

* * * * *